US010009026B2

United States Patent
Aliane et al.

(10) Patent No.: US 10,009,026 B2
(45) Date of Patent: Jun. 26, 2018

(54) TOUCH-SENSITIVE SENSOR AND METHOD FOR PRODUCING SUCH A SENSOR

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Mohammed Benwadih, Champigny sur Marne (FR); Olivier Haon, Saint Etienne de Crossey (FR)

(73) Assignee: COMMISSARIAT A L'ENERGIE ATOMIQUE AUX ENERGIES ALTERNATIVES, Paris (FR)

( * ) Notice: Subject to any disclaimer, the term of this patent is extended or adjusted under 35 U.S.C. 154(b) by 769 days.

(21) Appl. No.: 14/386,299

(22) PCT Filed: Mar. 28, 2013

(86) PCT No.: PCT/FR2013/050673
§ 371 (c)(1),
(2) Date: Dec. 5, 2014

(87) PCT Pub. No.: WO2013/153307
PCT Pub. Date: Oct. 17, 2013

(65) Prior Publication Data
US 2015/0096878 A1 Apr. 9, 2015

(30) Foreign Application Priority Data
Apr. 11, 2012 (FR) ...................... 12 53320

(51) Int. Cl.
*H03K 17/96* (2006.01)
*G06F 3/044* (2006.01)
(Continued)

(52) U.S. Cl.
CPC ......... *H03K 17/9622* (2013.01); *G06F 3/044* (2013.01); *H01L 41/0478* (2013.01);
(Continued)

(58) Field of Classification Search
CPC . H03K 17/9622; G06F 3/044; H01L 41/0478; H01L 41/1132
(Continued)

(56) References Cited

U.S. PATENT DOCUMENTS 3,691,555 A    9/1972  Looschen
4,688,306 A *  8/1987  Soni ...................... H01L 41/087
                                                         29/25.35
(Continued)

FOREIGN PATENT DOCUMENTS

EP    0528279 A1   2/1993
EP    0609021 A2   8/1994
(Continued)

OTHER PUBLICATIONS

Piezo Technologies—Technical Resource Paper.*
International Search Report Application No. PCT/FR2013/050673 Completed: Sep. 6, 2013; dated Sep. 12, 2013 pp. 7.

*Primary Examiner* — Bryan Gordon
(74) *Attorney, Agent, or Firm* — Forge IP, PLLC

(57) ABSTRACT

This touch-sensitive sensor includes a layer of piezoelectric material interposed between, on the one hand, first and second electrically-conductive elements and, on the other hand, at least one third conductive element including a surface opposite at least one of the first and second conductors.

13 Claims, 6 Drawing Sheets

(51) Int. Cl.
*H01L 41/113* (2006.01)
*H01L 41/257* (2013.01)
*H01L 41/29* (2013.01)
*H01L 41/047* (2006.01)

(52) U.S. Cl.
CPC ........ *H01L 41/1132* (2013.01); *H01L 41/257* (2013.01); *H01L 41/29* (2013.01); *H03K 17/962* (2013.01); *H03K 17/964* (2013.01); *H03K 17/9643* (2013.01); *G06F 2203/04101* (2013.01); *G06F 2203/04103* (2013.01); *G06F 2203/04105* (2013.01); *H03K 2017/9602* (2013.01); *H03K 2217/96023* (2013.01); *H03K 2217/96054* (2013.01); *H03K 2217/960755* (2013.01); *Y10T 29/42* (2015.01)

(58) Field of Classification Search
USPC ...................................... 310/323.21; 345/173
See application file for complete search history.

(56) References Cited

U.S. PATENT DOCUMENTS

| | | |
|---|---|---|
| 5,336,422 A | 8/1994 | Scheinbeim et al. |
| 5,494,617 A | 2/1996 | Iwamoto |
| 5,505,870 A | 4/1996 | Yoo et al. |
| 2006/0001655 A1 | 1/2006 | Tanabe |
| 2008/0259262 A1* | 10/2008 | Jones ..................... B82Y 10/00 349/139 |
| 2009/0135031 A1 | 5/2009 | Rockwell |
| 2010/0068460 A1 | 3/2010 | Moriyama et al. |
| 2010/0328264 A1 | 12/2010 | Yip |
| 2011/0080368 A1 | 4/2011 | Lee et al. |
| 2011/0095997 A1 | 4/2011 | Philipp |
| 2011/0155478 A1 | 6/2011 | Choi et al. |
| 2012/0075201 A1* | 3/2012 | Golovchenko ......... G06F 3/044 345/173 |
| 2012/0228993 A1* | 9/2012 | Colli .................... H01L 41/0478 310/313 R |
| 2012/0299638 A1* | 11/2012 | Han ........................ G06F 3/044 327/517 |
| 2013/0342801 A1* | 12/2013 | Hamada ................ G06F 3/0412 349/141 |

FOREIGN PATENT DOCUMENTS

| | | |
|---|---|---|
| EP | 1418491 A2 | 5/2004 |
| EP | 2075678 A2 | 7/2009 |
| KR | 101133141 B1 | 4/2012 |
| WO | 2011156447 A1 | 12/2011 |

* cited by examiner (Plane II-II)

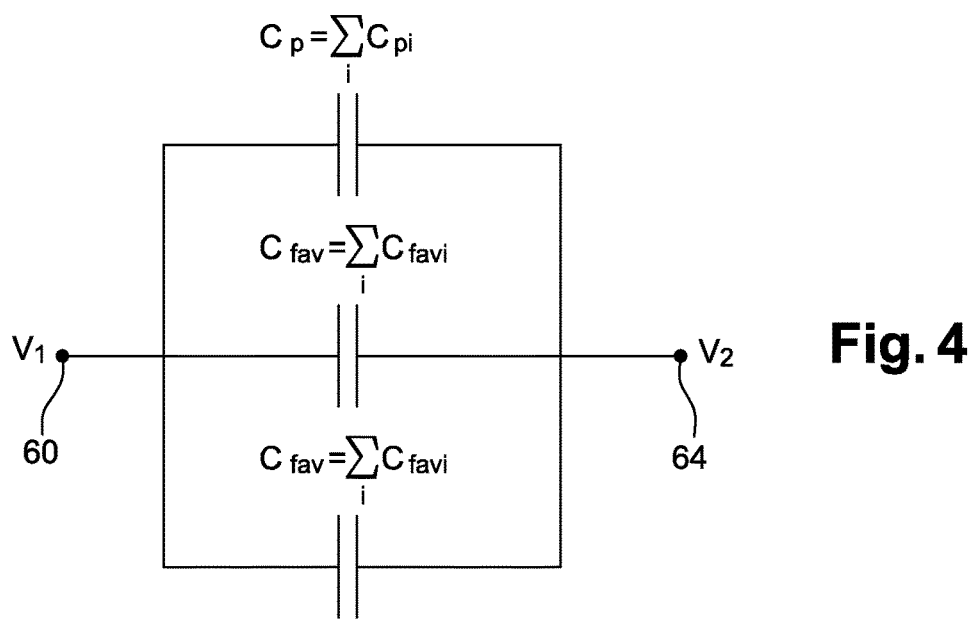
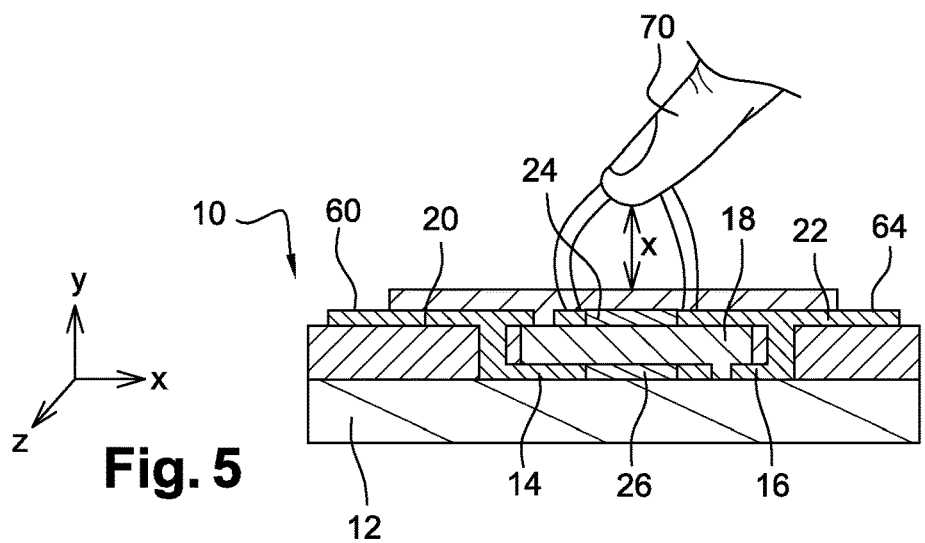
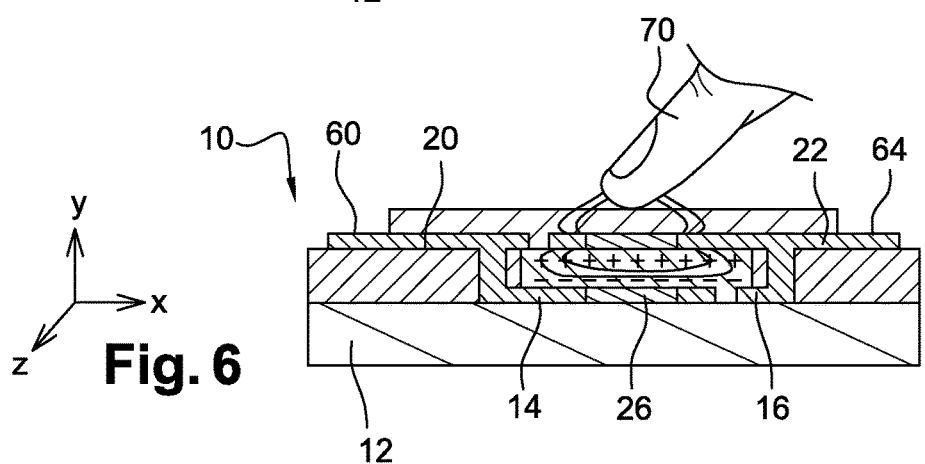

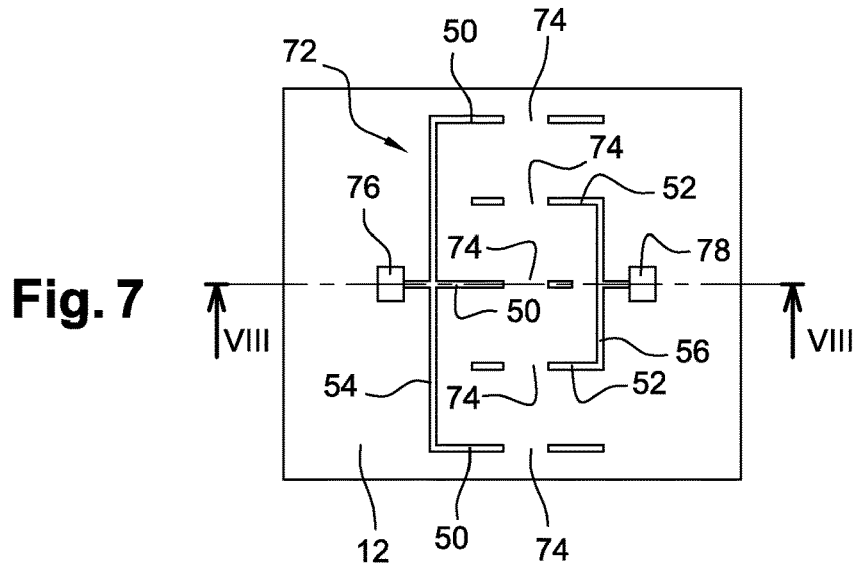
Fig. 7
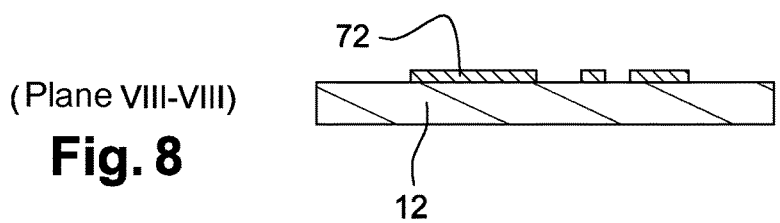
(Plane VIII-VIII)
Fig. 8
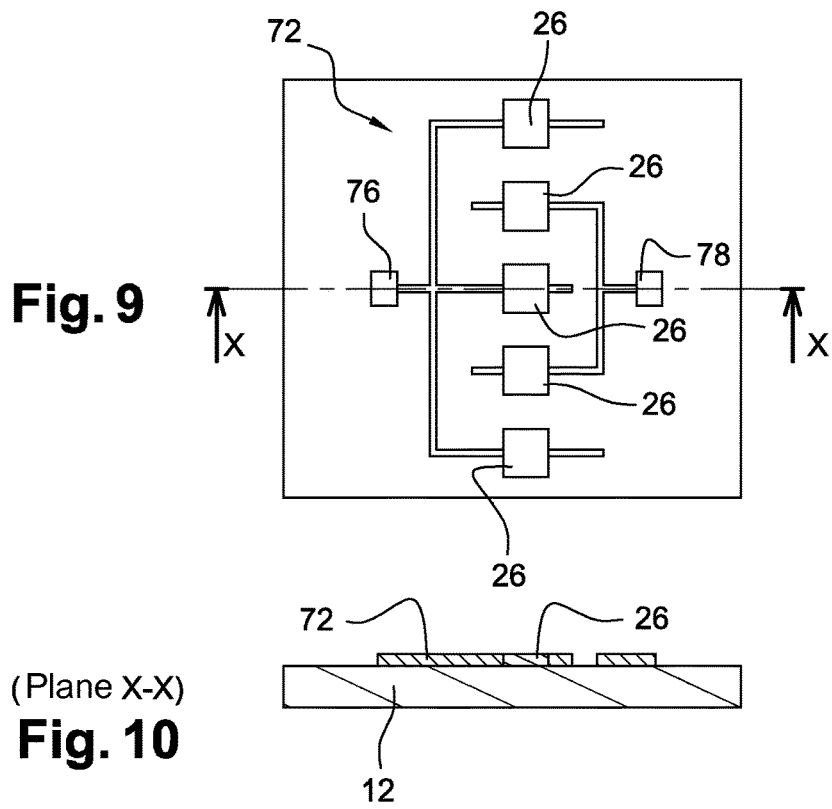
Fig. 9
(Plane X-X)
Fig. 10

(Plane XII-XII)

(Plane XIV-XIV)

(Plane XVI-XVI)

(Plane XVIII-XVIII)

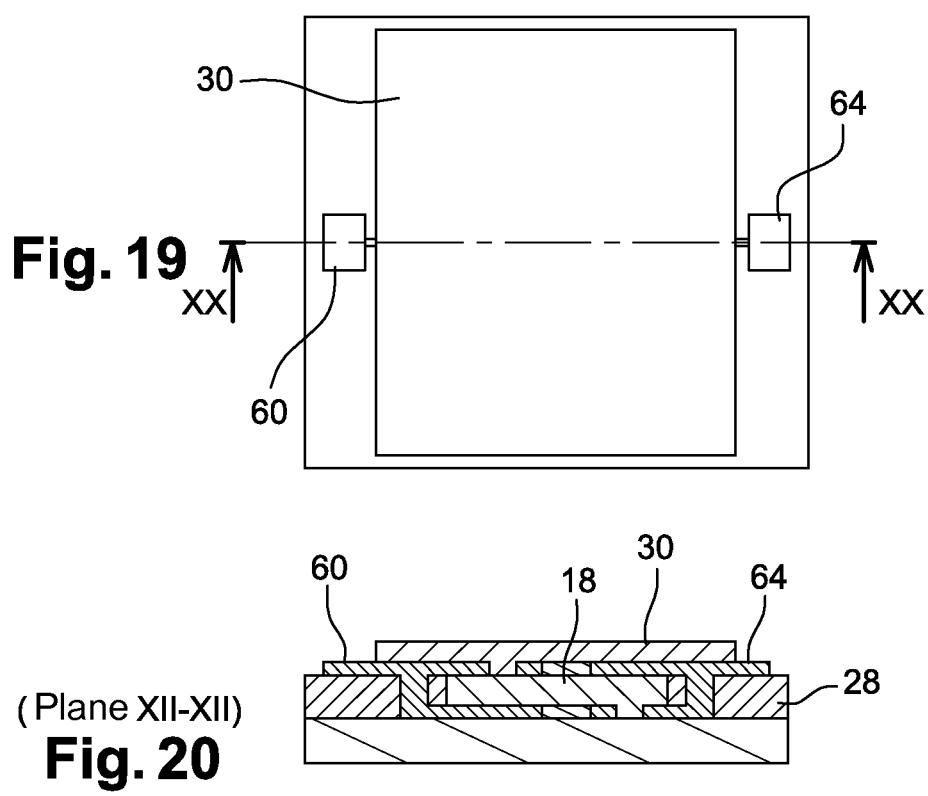

TOUCH-SENSITIVE SENSOR AND METHOD FOR PRODUCING SUCH A SENSOR

FIELD OF THE INVENTION

The invention relates to so-called "touch-sensitive" sensors, that is, that detect the presence of an object at their surface, and particularly to so-called "capacitive" touch-sensitive sensors detecting said presence by means of a variation of a capacitive property induced by the presence of the object close to or in contact with the sensor. The invention also relates to a pressure sensor detecting the presence of a force in contact with the sensor by means of the generation of an electric voltage across the sensor.

The invention particularly applies in displays, keyboards, and touch pads.

BACKGROUND OF THE INVENTION

Touch sensors which detect the presence of a finger at their surface by the resulting capacitance variation are known. Such sensors, usually called "capacitive touch-sensitive sensors", are for example used in displays, keyboards, and touch pads of computers, of so-called "smartphones", or of tablets.

Such sensors usually comprise at least two electrodes formed at the surface of a dielectric layer, and defining with said layer a capacitance of known value. This capacitance forms, with a finger located close to or in contact with the sensor, a capacitive system having a capacitance different from that of the sensor alone. The measurement of the capacitance difference resulting from the presence of a finger, and its comparison with the capacitance of the sensor alone, thus enables to detect the finger.

However, the detection of the presence of a finger close to or in contact with the sensor is generally insufficient to characterize a user's action. Indeed, the user usually intends to start an action by means of a display, of a keyboard, or of a touch pad by effectively pressing the latter. Now, although capacitive sensors "record" a capacitance variation in the presence of a finger, they do not enable to detect the pressure exerted by the latter.

SUMMARY OF THE INVENTION

The present invention aims at providing a capacitive sensor which also detects the pressure exerted at its surface by an object, particularly a finger.

For this purpose, the invention aims at a touch-sensitive sensor comprises a layer of piezoelectric material interposed between, on the one hand, first and second electrically-conductive elements and, on the other hand, at least one third conductive element comprising a surface opposite at least one of the first and second conductive elements.

Expression "opposite" particularly means that the projected surface of the conductive elements arranged on a first surface of the piezoelectric material layer, which projection is performed along an axis orthogonal to the main plane of said layer, on the second surface thereof, at least partially coincides with the conductive elements arranged on the second surface.

In other words, the dielectric layer of a capacitive touch-sensitive sensor of the state of the art is replaced with a piezoelectric layer and is interposed between conductive elements or "electrodes". Thus, the sensor according to the invention comprises a first capacitance formed by the first and second conductive elements and the piezoelectric layer, which enables to capacitively detect a finger close to said conductive elements in conventional fashion, and a second capacitance formed of the conductive elements having the piezoelectric layer interposed therebetween and having opposite surfaces. By pressing on the sensor, the piezoelectric material deforms and thus releases electric charges which are collected by the opposite conductive elements, which varies the voltage therebetween. The voltage variation thus is an image of the pressure exerted by an object at the sensor surface.

According to an embodiment of the invention, the first and second conductive elements each comprise a comb, and the combs of the first and second conductive elements are interdigited, such a structure enabling to capacitively detect the presence of an object on a large surface.

More particularly, the piezoelectric material layer is interposed between, on the one hand, the first and second conducive elements and, on the other hand, the third conductive element and a fourth conductive element, wherein the third and fourth conductive elements each comprise a comb, the combs of the third and fourth conductive elements being interdigited. Further, the teeth of the first conductive element are arranged opposite teeth of the fourth conductive element, and teeth of the second conductive element are arranged opposite teeth of the third conductive element. Such a structure enables to define a capacitance between each pair of opposite teeth, which enables to increase the sensor sensitivity. Further, the sensor has a symmetrical structure and allows a capacitive and pressure detection on both its surfaces.

Advantageously, the first conductive element is electrically connected to the third conductive element and the second conductive element is electrically connected to the fourth conductive element. Thus, the capacitances present in the sensor according to the invention are connected in parallel. Not only is the number of connections minimum, but it is also possible, by means of a single voltage between two terminals of the sensor, for example, two terminals respectively connected to the first and second conductive elements, to measure both capacitance variations due to the presence of a finger close to the sensor and voltage variations induced by the releasing of charges under the effect of a pressure exerted on the sensor.

Particularly, the arrangement of the first, second, third, and fourth conductive elements in the form of interdigited combs electrically connected in this manner, defines a maximum capacitance between the surfaces of the piezoelectric material layer. Indeed, the first and the third conductive elements form together a first three-dimensional structure with teeth alternately deposited on one surface, and then on the other surface of the piezoelectric layer. Similarly, the second and third conductive elements form together a second three-dimensional structure having its teeth alternately arranged on the surfaces of the piezoelectric layer. Thereby, a high vertical capacitance is obtained, each portion of the first structure arranged on a surface of the piezoelectric layer being opposite a corresponding portion of the second structure arranged on the other surface of the piezoelectric layer. The total resulting capacitance, which is the sum of the capacitances on the surfaces of the piezoelectric layer and of the capacitance between the surfaces thereof, is thus very high. This particularly enables to decrease the electric power supply voltage between the two structures.

According to an embodiment, graphene elements are formed inside of and/or in contact, on the one hand, with the first and second conductive elements and, on the other hand, with the piezoelectric material layer. Graphene elements are also formed inside of and/or in contact, on the one hand, with the second and fourth conductive elements and, on the other hand, with the piezoelectric material layer, and opposite the graphene elements formed inside of and/or in contact with the first and second conductive elements.

Graphene is a material having an electric conductivity which significantly increases according to temperature. Thus, when a finger is in contact or close to the graphene elements, they heat up, which increases their conductivity and thus makes their electric resistance drop. The charges released by the piezoelectric material are then collected more efficiently by the graphene elements, which thus increases the sensor sensitivity.

More particularly, the elements comprising graphene are graphene pads formed in the conductive elements. It is thus possible to form a network of graphene pads, and thus to make sure that at least part of them is heated up by the presence of a finger. As a variation, the conductive elements are entirely made of graphene.

According to an embodiment of the invention, the piezoelectric material is semi-crystalline or crystalline. More particularly, the piezoelectric material is a crystalline ferroelectric material with a mean polarization perpendicular to the opposite surfaces between, on the one hand, the first and second conductive elements and, on the other hand, the at least one third conductive element.

In preferred applications, the stack of the piezoelectric layer and of the conductive elements is formed on a flexible substrate and/or on a substrate covered with a flexible protection layer, that is, a substrate and a layer which deform without breaking, for example, a substrate and a layer made of plastic material. For obvious sensor robustness reasons, it is preferable for the piezoelectric layer not to separate from the substrate or from the flexible layer during the deformations applied to the sensor. A crystal structure is usually more deformable than an amorphous structure, and thus exhibits a smaller risk of separating from the substrate and the flexible layer.

Further, the temperature of a sensor may strongly vary during the operation thereof. Another source of mechanical weakness originates from the difference in thermal expansion coefficient between the piezoelectric layer, the substrate, and the protection layer, be the substrate and the layer flexible or not. Particularly, if, due to a significant temperature variation, the expansions and the contractions of these various elements differ too significantly, they will separate.

Some ferroelectric materials have a crystal structure as well as a spontaneous electric polarization, particularly crystalline polar pyroelectric ferroelectric materials. Permanently polarizing such ferroelectric materials by application of an appropriate electric field provides them with a piezoelectric property. For example, the piezoelectric material layer is obtained by application, between two surfaces of a layer of crystalline polar pyroelectric material, of an electric field having an intensity in the range from 30 MV/m (Mega Volt per meter) to 60 MV/m for between 1 hour and 8 hours, and by taking the ferroelectric material layer to a temperature lower than the Curie temperature of said material.

A crystal piezoelectric layer having a good mechanical behavior due to its crystalline nature with the substrate and the flexible layer is thus obtained. Further, it can be observed that such ferroelectric materials have a thermal expansion coefficient close to that of materials currently used for flexible substrates, particularly plastic substrates, such as polyethylene naphthalate ("PEN") and polyethylene terephthalate ("PET").

Particularly, the ferroelectric material is polyvinylidene fluoride ("PVDF") in beta phase, which is a phase having piezoelectric characteristics, a polyvinylidene fluoride copolymer: Poly (VDF-TrFe) poly(vinylidene fluoride-trifluoroethylene), lead titanium zirconate, or barium titanate.

According to an embodiment, the piezoelectric layer is formed on a flexible substrate, particularly a plastic substrate, such as a polyethylene naphthalate ("PEN") or polyethylene terephthalate ("PET") substrate.

The invention also aims at a method of manufacturing a touch-sensitive sensor of the above-mentioned type.

More particularly, the invention also aims at a method of manufacturing a touch-sensitive sensor, comprising:
  forming a layer of crystalline or semi-crystalline ferroelectric material interposed between, on the one hand, first and second electrically-conductive elements and, on the other hand, at least one third conductive element comprising a surface opposite at least one of the first and second conductive elements; and
  applying an electric field between, on the one hand, the first and second conductive elements and, on the other hand, the at least third conductive element, the electric field having an intensity in the range from 30 MV/m to 60 MV/m and being applied for between 1 hour and 8 hours, by heating the layer of ferroelectric material up to a temperature lower than the Curie temperature of said material.

According to an embodiment:
the forming of the piezoelectric layer interposed between the conductive elements comprises forming said layer interposed between, on the one hand, the first and second conductive elements and, on the other hand, the third conductive element and a fourth conductive element, each of the conductive elements comprising a comb, the combs of the first and second conductive elements being interdigited, the combs of the third and fourth elements being interdigited, teeth of the first conductive element being arranged opposite teeth of the fourth conductive element, and teeth of the second conductive element being arranged opposite teeth of the third conductive element,
the method further comprises forming a first connection element electrically connecting the first conductive element and the third conductive element, and a second connection element connecting the second conductive element and the fourth conductive element; and
the electric field is obtained by applying a potential difference between the first and second connection elements.

According to an embodiment, the ferroelectric material comprises polyvinylidene fluoride, a polyvinylidene fluoride copolymer, particularly a poly (VDF-TrFe), lead titanium zirconate, barium titanate, or a mixture thereof.

By applying the electric field between the conductive elements forming the sensor capacitances, an optimal polarization of the ferroelectric material is thus obtained, said polarization being due to the orientation of the dipoles in the ferroelectric material resulting from the application of an electric field.

According to an embodiment, the layer of ferroelectric material interposed between the conductive elements is formed:
  by forming the at least one third conductive element on a surface of a flexible substrate;
  by forming the ferroelectric material layer on the third conductive element and the substrate; and by forming the first and second conductive elements on the layer of ferroelectric material.

BRIEF DESCRIPTION OF THE DRAWINGS

The present invention will be better understood on reading of the following description provided as an example only in relation with the accompanying drawings, where the same reference numerals designate the same or similar elements, among which:

FIG. 4 is an equivalent electric diagram of the sensor of FIGS. 1 and 2;

FIG. 5 is a simplified cross-section view in plane II-II illustrating a capacitive detection mode of the sensor of FIGS. 1 and 2;

FIG. 6 is a simplified cross-section view in plane II-II illustrating a detection mode combining a capacitive and pressure detection of the sensor of FIGS. 1 and 2; and FIGS. 7 to 20 are simplified top and cross-section views illustrating a method of manufacturing a sensor according to the invention.

DETAILED DESCRIPTION OF THE INVENTION

Figure 1:
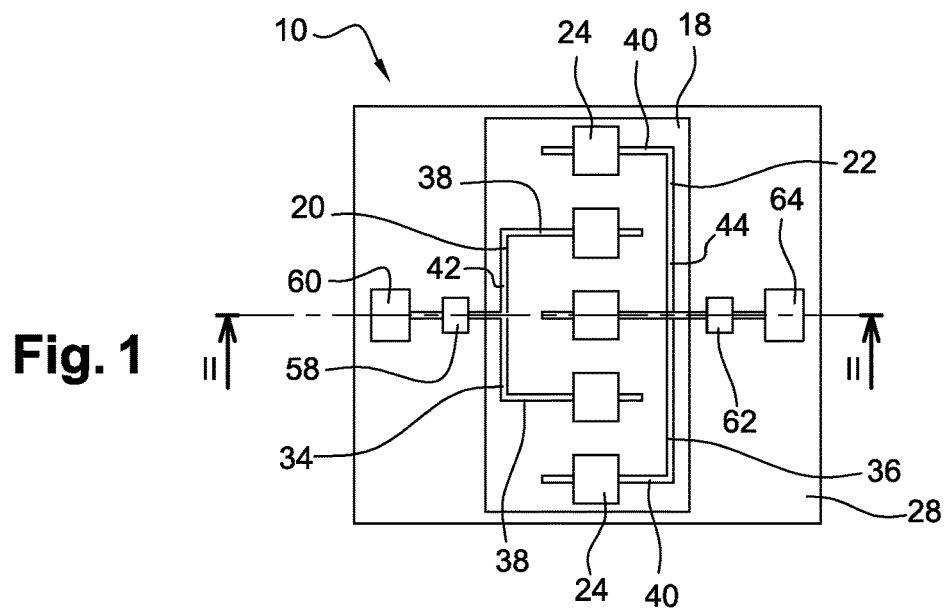
FIG. 1 is a simplified top view of a sensor according to the invention.
Figure 2:
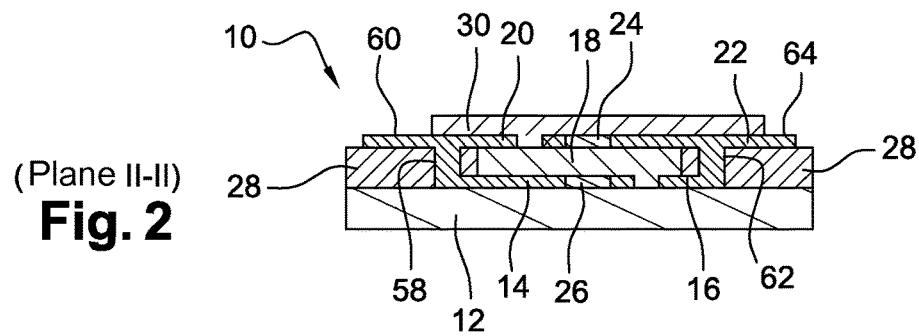
FIG. 2 is a simplified cross-section view along plane II-II of the sensor of FIG. 1.

Referring to FIGS. 1 and 2, a touch-sensitive sensor according to the invention comprises:
- a substrate 12, particularly a flexible plastic substrate, for example, a substrate made of polyethylene naphthalate ("PEN") or of polyethylene terephthalate) ("PET"), and having a thickness in the range from 25 to 200 micrometers;
- metal electrodes 14, 16 formed on substrate 12, or "rear" electrodes, for example, having a thickness in the range from 30 to 500 nanometers, and made of gold, of silver, of platinum, of copper, of nickel, of tungsten, of titanium, or the like;
- a piezoelectric material layer 18 formed on rear electrodes 14, 16, particularly having a layer of a thickness in the range from 1 to 10 micrometers;
- metal electrodes 20, 22 formed on piezoelectric layer 18, or "front" electrodes, for example, having a thickness in the range from 2 to 15 micrometers, and made of gold, of silver, of platinum, of copper, of nickel, of tungsten, of titanium, or the like. Front electrodes 20, 22 are arranged opposite electrodes 14, 16 to have opposite surfaces;
- graphene pads 24, 26, formed in front 18 and rear 14 electrodes and in contact with piezoelectric layer 18; and
- an encapsulation of front electrodes 20, 22 and of piezoelectric layer 18, comprising a lateral protection layer 28 formed on substrate 12 and an upper protection layer 30 (not shown in FIG. 1) formed on front electrodes 20, 22 and piezoelectric layer 18, and defining a touch-sensitive surface. Protection layers 28 and 30 are made of an insulating material, particularly a dielectric layer of low dielectric constant, for example, of fluorinated polymer or polyimide type. Advantageously, protection layer 30 is flexible to deform under the pressure exerted by a finger and has for this purpose a thickness in the range from 100 nm to 5 µm.

Front electrodes 20, 22 each advantageously comprise a comb 34, 36. Combs 34, 36 of the front electrodes are interdigited, teeth 38 of a comb 34 being interposed between teeth 40 of the other comb 36.

For example, combs 34, 36 have parallel teeth 38, 40 of same length, respectively attached to armatures 42, 44.

After, comb 34 will be called "left-hand" comb due to its armature 42 arranged on the left-hand side of the drawings, and comb 36 will be called "right-hand" comb due to its armature 44 arranged on the right-hand side of the drawings.

Figure 3:
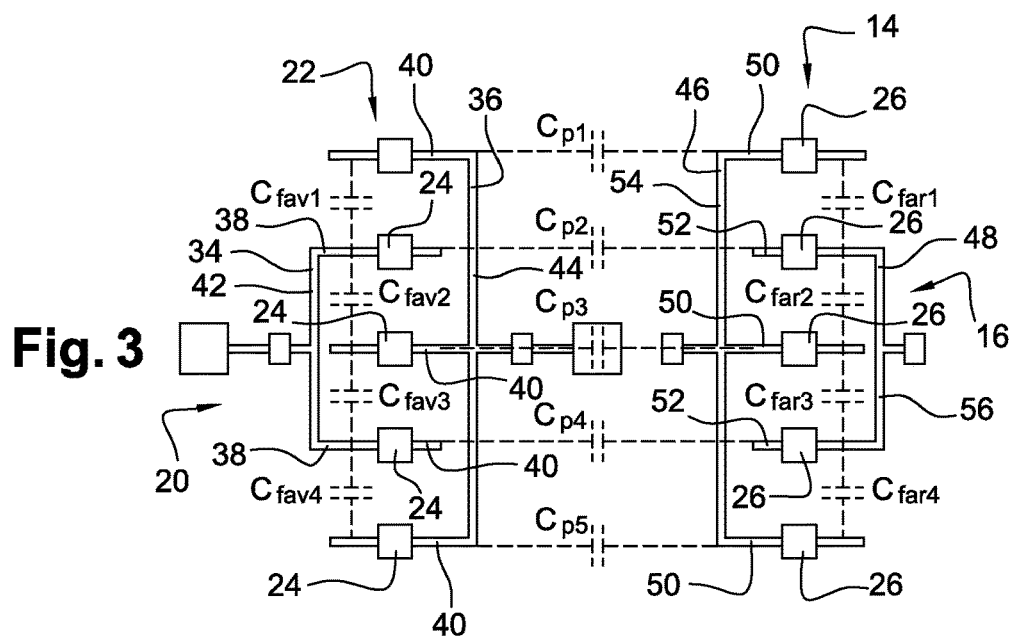
FIG. 3 is a top view of the front (left-hand portion of the drawing) and rear (right-hand portion of the drawing) electrodes of the sensor of FIGS. 1 and 2, also illustrating the different capacitances present in this sensor between the different electrode portions present.

Referring to FIG. 3, which illustrates in top view the front electrodes (on the left-hand side of FIG. 3) and the rear electrodes (on the right-hand side of FIG. 3), rear electrodes 14, 16 also each comprise a comb 46, 48, combs 46, 48 of the rear electrodes are interdigited, teeth 50 of a comb 46 being interposed between teeth 52 of the other comb 48.

Teeth 50, 52 of combs 46, 48 are respectively attached to armatures 54, 56. After, comb 46 will be called "left-hand" comb due to its armature 54 arranged on the left-hand side of the drawings, and comb 48 will be called "right-hand" comb due to its armature 56 arranged on the right-hand side of the drawings.

Front left-hand comb 34 is an identical reflection of rear right-hand comb 48 and is arranged opposite thereto. Similarly, front right-hand comb 36 is an identical reflection of rear left-hand comb 48 and is arranged opposite thereto. Thus, teeth 38, 40 of the front right-hand and left-hand combs 34, 36 are arranged opposite teeth 50, 52 of the left-hand and right-hand combs 46, 48, respectively.

Sensor 10 further comprises connection elements electrically connecting the front and rear left-hand combs 34, 46, particularly a through metal via 58 formed across the thickness of protection layer 28, as well as a metal area 60 electrically connected to left-hand combs 34, 46 and formed on protection layer 28. Similarly, sensor 10 comprises connection elements electrically connecting the front and rear right-hand combs 36, 48, particularly a through metallized via 62 formed across the thickness of protection layer 28, as well as a metal area 64 electrically connected to right-hand combs 36, 48 and formed on protection layer 28.

A graphene pad 24, 26 is further formed in each of the teeth of combs 34, 36, 46, 48, a graphene pad of a front comb being preferably arranged opposite a graphene pad of a rear comb, which enables to keep the general symmetry of sensor 10.

Advantageously, graphene pads 24, 26 have an area in the range from 50 µm×50 µm to 500 µm×500 µm, and are thus particularly adapted to the sensor size. As known per se, graphene is a material having an electric conductivity strongly increasing with temperature. Thus, as the temperature increases, for example due to the presence of a finger, the electric charges released by the piezoelectric material of layer 18 under the effect of a pressure exerted thereon are locally by a large number and are more easily collected by means of said pads, which all the more increases the electric capacitance of the assembly, as will be described in further detail hereafter.

As illustrated in FIG. 3, the electrode structure just described thus defines, in combination with piezoelectric layer 18:
- a capacitance $C_{f_{avi}}$ between each pair of adjacent teeth 38, 40 of front combs 36, 38;

a capacitance $C_{fari}$ between each pair of adjacent teeth 50, 52 of rear combs 46, 48;

a capacitance $C_{pi}$ between each pair of teeth 38, 52 opposite front left-hand and rear right-hand combs 34 and 48 and between each pair of teeth 40, 50 opposite front right-hand rear left-hand combs 36 and 46;

a parallel connection of all the capacitances $C_{favi}$, $C_{fari}$, $C_{pi}$ thus defined.

FIG. 4 illustrates an equivalent electric diagram of sensor 10 just described between metal areas 60, 64. This diagram illustrates three capacitances in parallel, that is:

a first capacitance $C_p$ equal to sum $$\sum_i C_{pi}$$

of capacitances $C_{pi}$, a second capacitance $C_{fav}$ equal to sum $$\sum_i C_{favi}$$

of capacitances $C_{favi}$, a third capacitance $C_{far}$ equal to sum $$\sum_i C_{fari}$$

of capacitances $C_{fari}$.

It should in particular be noted that two independent three-dimensional electrodes are formed, that is, a first electrode formed of front left-hand comb 34, of rear left-hand comb 46, and of connection element 58, and a second electrode formed of front right-hand comb 3, of rear right-hand comb 48, and of connection element 62. Each of these electrodes comprises teeth which are alternately arranged on the front surface and on the rear surface of piezoelectric layer 18 and for each of the portions of an electrode arranged on a surface of layer 18, there exists a corresponding opposite portion on the other surface of layer 18. Thereby, "vertical" capacitance $C_p$ has a maximum value. Similarly, for each surface of layer 18, a portion of the first electrode is located opposite at least one, and two for teeth which are not located in end positions, corresponding portion of the second electrode. "Horizontal" capacitances $C_{fav}$ and $C_{far}$ each have a maximum value. This results in a maximum general capacitance between the two electrodes. This particularly enables, if desired, to decrease the power supply voltages between the two electrodes.

Piezoelectric layer 18 advantageously is a layer made of polarized crystalline or semi-crystalline ferroelectric material, particularly a ferroelectric material based on PVDF (polyvinylidene fluoride) and/or of PVDF copolymers, for example, a poly (VDF-TrFe) with adapted compositions, of PZT (lead titanium zirconate), of $BaTiO_3$ (barium titanate), of $PbTiO_3$ (lead titanate), or of a mixture of these materials.

Advantageously, the ferroelectric material of layer 18 is polarized, in average, along a direction perpendicular to the planes having front 20, 22 and rear 14, 16 electrodes formed therein. For example, such a polarization is obtained permanently by applying between the two surfaces of layer 18 an electric field having an intensity in the range from 30 MV/m to 60 MV/m across the thickness of layer 18, for between 1 hour and 8 hours, and by taking layer 18 to a temperature lower than the Curie temperature of the ferroelectric material.

For more details relative to the polarization of a ferroelectric material, reference may for example be made to document U.S. Pat. No. 5,494,617.

Thereby, the ferroelectric material is polarized perpendicularly to the opposite surfaces of the front and rear electrodes, which enables to obtain a significant piezoelectric effect in said direction. Particularly, the electric field is applied by means of the actual front and rear electrodes by connecting metal areas 60, 64 to a voltage source. Thereby, the dipoles of the ferroelectric material of layer 18 are directed along the electric field lines between these electrodes, which optimizes the piezoelectric effect.

The sensor according to the invention thus combines two different detection modes to detect the presence of a finger at its surface, that is, a capacitive detection mode and a piezoelectric detection mode. More particularly, the voltage between areas 60, 64 varies according to the capacitance variation due to the presence of a finger and the release of charges by layer 18 under the effect of a pressure exerted thereon.

Particularly, when no object is close to sensor 10, the latter thus has a capacitance of predetermined value between areas 60, 64. However, when an object, particularly a finger 70, comes closer to front electrodes 20, 22, or to rear electrodes 14, 16, without pressing on sensor 10, as illustrated in the simplified cross-section view of FIG. 5, a new capacitance, having its value depending on distance x between object 70 and sensor 10, is added in parallel with capacitances $C_p$, $C_{fav}$ and $C_{far}$ already present in sensor 10. The total capacitance between areas 60 and 64 is thus modified. By connecting areas 60 and 64 to a capacitance measurement device, it is thus possible to measure the capacitance variation between said areas 60, 64, and thus to detect the presence of finger 70. Such devices, or "capacitance meters", are conventional and will not be described in further detail.

In piezoelectric detection mode, after the alignment of the dipoles in the ferroelectric material, said material is made piezoelectric, that is, electric charges are generated when a pressure is exerted on layer 18 along the polarization direction. Thus, an object, for example, a finger 70, pressing on the front or rear surface of sensor 10, as illustrated in the simplified cross-section view of FIG. 7, causes a variation of the voltage between metal areas 60, 64. By connecting areas 60 and 64 to a voltage measurement device, it is thus possible to measure said voltage variation and thus to detect the pressure exerted by an object on sensor 10, particularly a finger 70.

Further, when a finger 70 is in contact with the detector without pressing thereon above a graphene pad 24, 26, the latter undergoes a significant local heating due to the very good thermal conductivity of graphene, which makes the electric resistance of graphene drop. Thereby, a better electron flow through the interface between the piezoelectric material and the graphene pad is obtained, which accordingly provides a high electric field at this interface. Further, with the effect of temperature at this interface, an increase of the piezoelectric constant of the piezoelectric material can be observed, which accordingly increases the sensitivity of this sensor when a finger exerts a pressure on the sensor. Further, graphene locally increases the sensor capacitance.

A method of manufacturing a touch-sensitive sensor according to the invention will now be described in relation with FIGS. 7 to 20.

The method starts with the forming of a flexible plastic substrate 12, for example, a substrate made of polyethylene naphthalate ("PEN") or of polyethylene terephthalate ("PET") having a thickness in the range from 25 to 200 micrometers, and then carries on with the deposition on substrate 12, for example, by sputtering or physical vapor deposition, of a metallization 72 across a thickness in the range from 30 and 500 nanometers, for example, gold (Au), silver (Ag), platinum (Pt), copper (Cu), nickel (Ni), tungsten (W), or titanium (Ti).

Metallization 72 comprises two armatures 54, 56 from which parallel interdigited teeth 50, 52, of same length, are formed. Teeth 50, 52 are not completed and exhibit voids 74 at the locations desired for the graphene pads. Each of armatures 54, 56 is further connected to a metal area 76, 78 (FIG. 7 in top view and FIG. 8 in cross-section view along plane VIII-VIII).

At a next step, conductive graphene pads 26, having a thickness in the range from 100 nm to a few µm, are deposited, for example, by silk screening, on voids 74 formed in teeth 50, 52 (FIG. 9 in top view and FIG. 10 in cross-section view along plane X-X). Previously-described rear electrodes 14, 16 are thus obtained.

Figure 11:
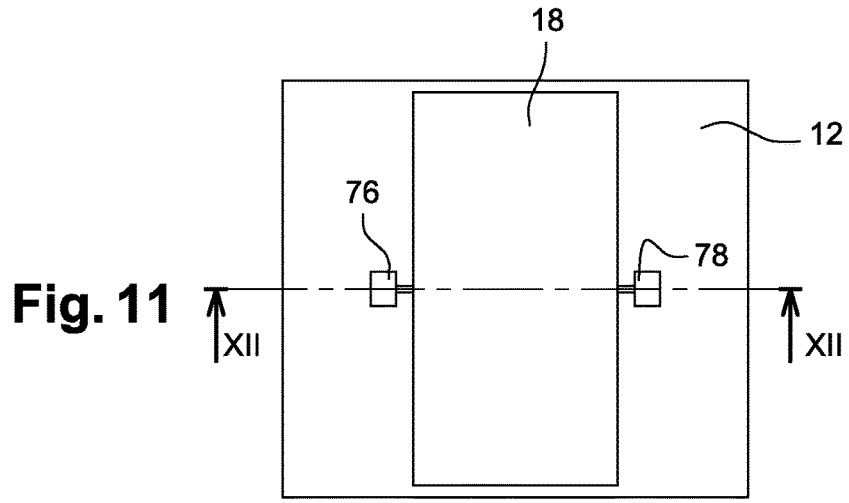
Figure 12:
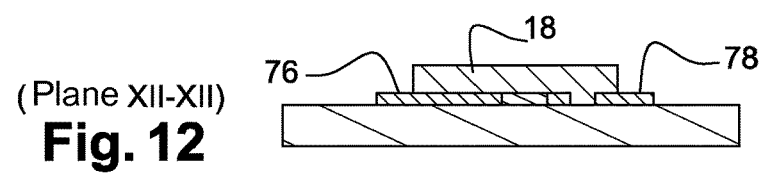

The method then carries on with the deposition, for example, by silk screening or inkjet printing, of a piezoelectric layer 18, having a thickness in the range from 1 and 10 micrometers, on rear electrodes 14, 16 without covering metal areas 76, 78 (FIG. 11 in top view and in FIG. 12 in cross-section view along plane XII-XII). The piezoelectric material advantageously is a crystalline polar ferroelectric material, particularly PVDF, a copolymer of PVDF, PZT, $BaTiO_3$, or $PbTiO_3$.

Figure 13:
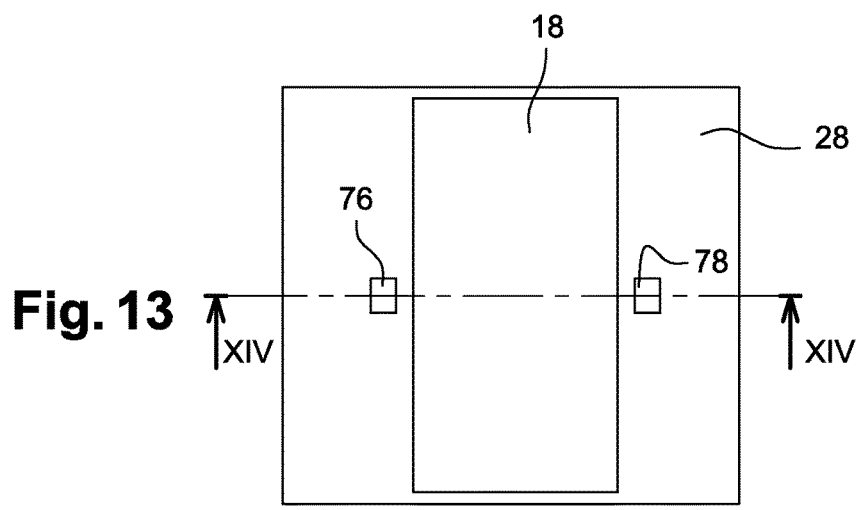
Figure 14:
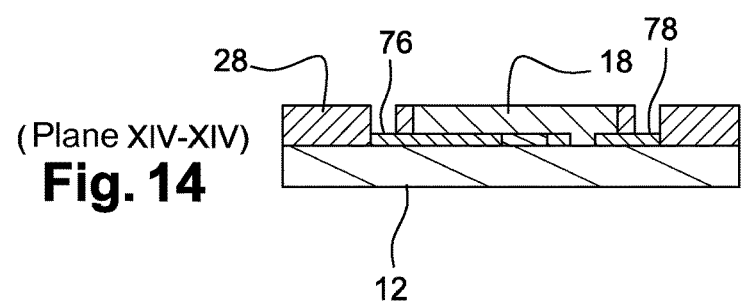

A layer 28 of insulation dielectric is then formed on substrate 12 around and at the level of layer 18 without covering metal areas 76, 78, and more particularly a non ferroelectric dielectric layer, such as for example, a fluoropolymer dielectric layer of low dielectric constant (FIG. 13 in top view and FIG. 14 in cross-section view along plane XIV-XIV). For example, layer 28 is deposited full plate by silk-screening or inkjet printing with via openings to leave areas 76, 78 uncovered.

The method then carries on with the deposition on layer 18 and layer 28, for example, by sputtering or physical vapor deposition, of a metallization 80 across a thickness in the range from 2 to 15 micrometers, for example, gold (Au), silver (Ag), platinum (Pt), copper (Cu), nickel (Ni), tungsten (W), or titanium (Ti).

Metallization 80 comprises two armatures 42, 44 from which parallel interdigited teeth 38, 40, of same length, are formed. Teeth 38, 40 are not completed and comprise voids 82 at the locations desired for graphene pads 24. Armatures 42, 44 are further respectively connected to metal areas 76, 78, metallization 80 filling the openings formed in layer 28 in line with areas 76, 78.

Figure 15:
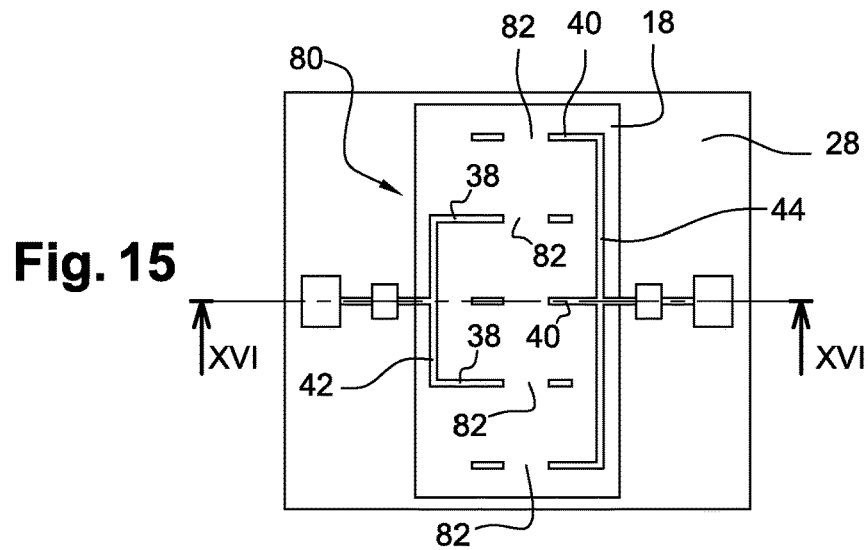
Figure 16:
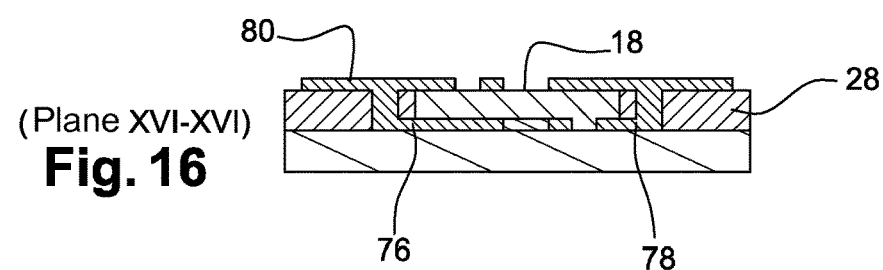

Finally, metallization 80 comprises areas 60, 64 respectively connected to armatures 42, 44 (FIG. 15 in top view and FIG. 16 in cross-section view along plane XVI-XVI).

Figure 17:
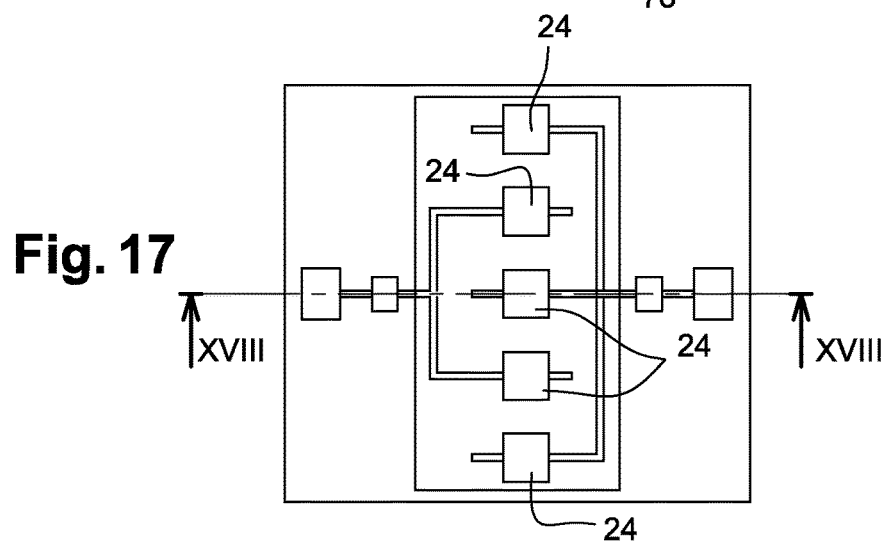
Figure 18:
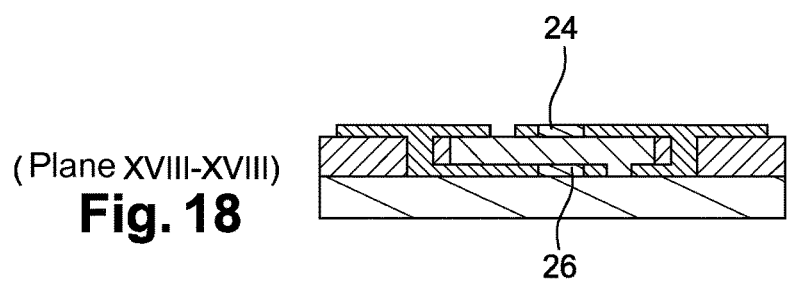

Conductive graphene pads 24, having a thickness in the range from 100 nm to 10 µm, are deposited, for example, by silk screening, on voids 82 formed in teeth 38, 40 (FIG. 17 in top view and FIG. 18 in cross-section view along plane XVIII-XVIII). Previously-described front electrodes 20, 22 are thus obtained.

A flexible dielectric protection and insulation layer 30 having a low dielectric constant, for example, a layer of fluorinated polymer or of polyimide having a thickness in the range from 100 nm to 5 µm, is then deposited on front electrodes 20, 22, layer 18, and protection layer 28, while leaving metal areas 60, 64 free (FIG. 19 in top view and FIG. 20 in cross-section view along plane XX-XX).

The method then carries on with the application of a voltage between metal areas 60, 64, for example, by means of a voltage source, to define between the front and rear electrodes an electric field having an intensity in the range from 30 MV/m to 60 MV/m across the thickness of layer 18. The voltage, and thus the field, is applied for between 1 hour and 8 hours, and the sensor is heated up to a temperature lower than the Curie temperature of said material, for example, by arranging the sensor on a temperature-regulated heating support. The ferroelectric material thus acquires previously-described piezoelectric properties.

An embodiment of a sensor according to the invention where the front and rear electrodes comprise opposite interdigited combs has been described. The geometry and dimension of the combs, as well as the number of teeth, are advantageously selected to set the capacitances present in the sensor.

Similarly, the sensor may, as a variation, have a single rear surface electrode having a surface opposite that of the electrodes arranged at the front surface.

Similarly, a diagram of parallel connection of the capacitances has been described. As a variation, the electrodes are not interconnected and are submitted to a potential which is specific thereto.

Similarly, a piezoelectric layer formed from a polarized crystalline ferroelectric material has been described. As a variation, the piezoelectric layer may be made of any piezoelectric material, or of a non-ferroelectric crystalline piezoelectric material.

Similarly, graphene pads formed in the front and rear electrodes have been described. As a variation, only the front electrodes comprise such pads.

Also as a variation, the graphene pads are formed on the piezoelectric layer and in contact with the electrodes without being part of it.

Also as a variation, the front and/or rear electrodes are made of graphene.

The invention claimed is:
1. A touch-sensitive sensor comprising:
a layer of piezoelectric material with first and second electrically-conductive elements disposed on a first side of said layer of piezoelectric material and third and fourth conductive elements disposed on a second side of said layer of piezoelectric material, at least one of the third and fourth conductive elements comprising a surface opposite at least one of the first and second conductive elements;
wherein the first and second electrically-conductive elements each comprise a comb, and wherein the combs of the first and second conductive elements are interdigited;
wherein the third and fourth electrically-conductive elements each comprise a comb, the combs of the third and fourth conductive elements being interdigited, and wherein:
teeth of the first conductive element are arranged opposite teeth of the fourth conductive element; and
teeth of the second conductive element are arranged opposite teeth of the third conductive element; and wherein the first conductive element is electrically connected to the third conductive element, and wherein the second conductive element is electrically connected to the fourth conductive element.

2. The touch-sensitive sensor of claim 1, wherein graphene elements are formed inside of and/or in contact with the first and second electrically-conductive elements and in contact with the piezoelectric material layer.

3. The touch-sensitive sensor of claim 1, wherein graphene elements are formed inside of and/or in contact with the second and fourth conductive elements and in contact with the piezoelectric material layer, and opposite the graphene elements formed inside of and/or in contact with the first and second conductive elements.

4. The touch-sensitive sensor of claim 3, wherein the elements comprising graphene are graphene pads formed in the conductive elements.

5. The touch-sensitive sensor of claim 1, wherein the piezoelectric material is a crystalline or semi-crystalline ferroelectric material having a mean polarization perpendicular to the opposite surfaces between the first and second electrically-conductive elements and the third and fourth conductive elements.

6. The touch-sensitive sensor of claim 1, wherein the piezoelectric material is a crystalline or semi-crystalline ferroelectric material polarized along the electric field lines appearing between the opposite surfaces between the first and second electrically-conductive elements and the third and fourth conductive elements when a potential difference is applied between said opposite surfaces.

7. The touch-sensitive sensor of claim 5, wherein the ferroelectric material comprises polyvinylidene fluoride, a copolymer of polyvinylidene fluoride, particularly poly (VDF-TrFe), lead titanium zirconate, barium titanate, or a mixture thereof.

8. The touch-sensitive sensor of claim 6, wherein the ferroelectric material comprises polyvinylidene fluoride, a copolymer of polyvinylidene fluoride, particularly poly (VDF-TrFe), lead titanium zirconate, barium titanate, or a mixture thereof.

9. The touch-sensitive sensor of claim 1, wherein the piezoelectric layer is formed on a flexible substrate.

10. A method of manufacturing a touch-sensitive sensor comprising:
    forming a layer of crystalline or semi-crystalline ferroelectric material interposed between, on one side, first and second electrically-conductive elements and, on an opposite side, at least one third conductive element comprising a surface opposite at least one of the first and second conductive elements; and
    applying an electric field between, on one side, the first and second electrically-conductive elements and, on an opposite side, the at least one third conductive element, the electric field having an intensity in the range from 30 MV/m to 60 MV/m, and being applied for between 1 hour and 8 hours, by heating the ferroelectric material layer to a temperature lower than the Curie temperature of said material;
    wherein:
    the forming of the piezoelectric layer interposed between the conductive elements comprises forming said layer interposed between, on one side, the first and second electrically-conductive elements and, on an opposite side, the third conductive element and a fourth conductive element, each of the conductive elements comprising a comb, the combs of the first and second conductive elements being interdigited, the combs of the third and fourth conductive elements being interdigited, teeth of the first conductive element being arranged opposite teeth of the fourth conductive element, and teeth of the second conductive element being arranged opposite the third conductive element;
    a first connection element is formed by electrically connecting the first conductive element and the third conductive element and a second connection element connecting the second conductive element and the fourth conductive element are formed; and
    the electric field is obtained by applying a potential difference between the first and second connection elements.

11. The touch-sensitive sensor manufacturing method of claim 10, wherein the ferroelectric material comprises polyvinylidene fluoride, a copolymer of polyvinylidene fluoride, particularly poly (VDF-TrFe), lead titanium zirconate, barium titanate, or a mixture thereof.

12. The touch-sensitive sensor manufacturing method of claim 10, wherein the ferroelectric material comprises polyvinylidene fluoride, a copolymer of polyvinylidene fluoride, particularly poly (VDF-TrFe), lead titanium zirconate, barium titanate, or a mixture thereof.

13. The touch-sensitive sensor manufacturing method of claim 10, wherein the ferroelectric material layer interposed between the conductive elements is formed:
    by forming the at least one third conductive element on a surface of a flexible substrate;
    by forming the ferroelectric material layer on the third conductive element and the substrate; and
    by forming the first and second conductive elements on the ferroelectric layer.

* * * * *